(12) United States Patent
Khor et al.

(10) Patent No.: US 9,548,743 B1
(45) Date of Patent: *Jan. 17, 2017

(54) IC AND A METHOD FOR FLEXIBLE INTEGER AND FRACTIONAL DIVISIONS

(71) Applicant: Altera Corporation, San Jose, CA (US)

(72) Inventors: Chuan Thim Khor, Teluk Intan (MY); Teng Chow Ooi, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/199,930

(22) Filed: Mar. 6, 2014

Related U.S. Application Data (63) Continuation of application No. 13/431,905, filed on Mar. 27, 2012, now Pat. No. 8,693,616.

(51) Int. Cl.
| | |
|---|---|
| *H03K 21/00* | (2006.01) |
| *H03K 23/00* | (2006.01) |
| *H03L 7/193* | (2006.01) |
| *H03K 23/54* | (2006.01) |
| *G06F 1/08* | (2006.01) |
| *H03L 7/197* | (2006.01) |

(52) U.S. Cl.
CPC .............. *H03K 21/00* (2013.01); *G06F 1/08* (2013.01); *H03K 23/54* (2013.01); *H03L 7/193* (2013.01); *H03L 7/1974* (2013.01)

(58) Field of Classification Search
None
See application file for complete search history.

(56) References Cited

U.S. PATENT DOCUMENTS

| | | | | |
|---|---|---|---|---|
| 5,339,079 | A  * | 8/1994 | Ledzius et al. | 341/144 |
| RE35,254 | E  * | 5/1996 | Chaisemartin et al. | 377/47 |
| 5,670,904 | A  * | 9/1997 | Moloney et al. | 327/277 |
| 5,754,615 | A  * | 5/1998 | Colavin | 377/47 |
| 6,009,139 | A  * | 12/1999 | Austin et al. | 377/47 |
| 6,424,691 | B1 * | 7/2002 | Neravetla et al. | 377/48 |
| 6,566,918 | B1 * | 5/2003 | Nguyen | 327/115 |
| 6,970,025 | B2 * | 11/2005 | Magoon et al. | 327/115 |
| 7,139,361 | B1 * | 11/2006 | Nguyen | 377/47 |
| 7,180,974 | B2 | 2/2007 | De Gouy et al. | |
| 7,268,597 | B2 * | 9/2007 | Miller, Jr. | 327/117 |
| 7,564,276 | B2 * | 7/2009 | Narathong et al. | 327/117 |
| 8,023,612 | B2 * | 9/2011 | Rose et al. | 377/70 |
| 8,599,997 | B2 * | 12/2013 | Chen et al. | 377/47 |
| 8,693,616 | B1 | 4/2014 | Khor et al. | |
| 2005/0180539 | A1* | 8/2005 | De Gouy et al. | 377/47 |

(Continued)

OTHER PUBLICATIONS

U.S. Appl. No. 14/199,930, filed Mar. 6, 2014, IC and a Method for Flexible Integer and Fractional Divisions, Chuan Thim Khor.

*Primary Examiner* — Tuan T Lam
(74) *Attorney, Agent, or Firm* — Okamoto & Benedicto LLP

(57) ABSTRACT

An IC that performs integer and fractional divisions is disclosed. The IC comprises a plurality of shift registers that forms a shift register ring. Consecutive shift registers are coupled to each other through a multiplexer. The IC also includes a multiplexer controller that determines the shift registers to be activated within the shift register ring. The multiplexer controller determines the activation based upon a divisional factor. The IC also includes a pattern controller that generates the control signal to program the shift register.

20 Claims, 9 Drawing Sheets

(56) References Cited

U.S. PATENT DOCUMENTS

2007/0160179 A1* 7/2007 Narathong et al. ............. 377/47
2009/0122937 A1* 5/2009 Maskou et al. ............... 375/362
2009/0213980 A1* 8/2009 Ding et al. ...................... 377/48

* cited by examiner

IC AND A METHOD FOR FLEXIBLE INTEGER AND FRACTIONAL DIVISIONS

BACKGROUND

A transceiver within an Integrated Circuit (IC) plays an important role to enable high speed digital data communications. Transceivers, typically, include transmitter circuitry to transmit signals and receiver circuitry to receive signals. The receiver circuitry may be built with multiple blocks of specialized circuitry, e.g., First-in-First-out (FIFO) registers, deserializers, and phase lock loop (PLL) and clock and data recovery (CDR) circuitry, etc.

A PLL may be used to generate a clock signal with different phases or frequencies based on an input reference clock. The PLL may include a voltage control oscillator (VCO) and a phase detector circuit. The PLL circuit may further include frequency divider circuits for dividing the frequency of an output signal generated by the VCO. Accordingly, the output signal may be analyzed by a phase detector after it has been divided to determine the phase differences. This improves the PLLs function to generate the clock. Two types of frequency dividers include integer frequency dividers and fractional frequency dividers.

A problem with conventional frequency dividers is that it has a fixed divisional factor. Thus, it limits the ability to carry out functions based on different divisional factors. Add-on logic may be used to provide flexibility to conventional frequency dividers such that they are not fixed to a specific division factor but the drawbacks of the add-on logic is that it may reduce the speed of carrying out frequency divisional. Furthermore, the add-on logic is known to increase power consumption and area utilization within the IC.

It is within this context that the embodiments described herein arise.

SUMMARY

Embodiments described herein provide an IC and a method for flexible integer and fractional divisions. It should be appreciated that the present embodiments can be implemented in numerous ways, such as a process, an apparatus, a system, a device, or a method. Several inventive embodiments are described below.

In one embodiment, an IC is described. The IC includes a plurality of shift registers that forms a shift register ring. Each of the consecutive shift registers in the shift register ring is coupled to each other through a multiplexer. The IC also includes a multiplexer controller that determines which of the shift registers are to be activated within the shift register ring. The multiplexer controller determines the activation based on a particular division factor. The IC also includes a pattern controller that generates a control signal that may be utilized to configure the shift registers.

In another embodiment, a frequency divider circuit is described. The frequency divider circuit includes a shift register ring, a multiplexer controller and a pattern controller. The shift register ring includes sequential shift registers where each consecutive shift register is coupled through a multiplexer. The multiplexer controller determines a number of sequential shift registers to be activated. The pattern controller provides a control signal to the activated shift registers.

In another embodiment, a method of operating a programmable divider is described. The method includes generating a control signal for a desired division factor. The method further includes utilizing the control signal to configure a shift register ring. The method may also include activating a number of shift registers within the shift register ring to obtain a particular division factor. The method may further include outputting the result of the division from the shift registers.

Other aspects of the embodiments will become apparent from the following detailed description, taken in conjunction with the accompanying drawings, illustrating by way of example of the principle of the embodiments.

BRIEF DESCRIPTION OF THE DRAWINGS

The embodiments may be understood by reference to the following description taken in conjunction with the accompanying drawings.

DETAILED DESCRIPTION

The following embodiments describe an integrated circuit (IC) and a method for dividing a signal frequency. It will be obvious, however, to one skilled in the art, that the present embodiments may be practiced without some or all of these specific details. In other instances, well-known operations have not been described in detail in order not to unnecessarily obscure the present invention.

In one embodiment, an IC with a frequency divider circuit is provided. The frequency divider circuit is configurable to have an integer divisional factor or a fractional divisional factor. The frequency divider circuit may also be configured with different divisional factors. The frequency divider circuit may perform the division operation at a relatively faster speed than the conventional system.

Figure 1:
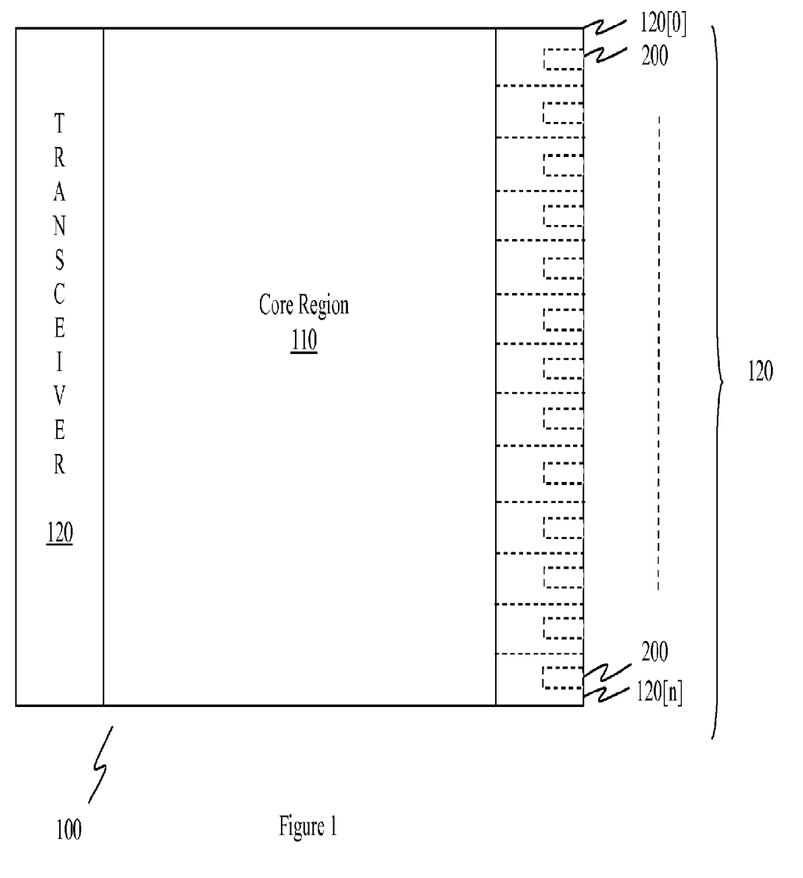
FIG. 1, meant to be illustrative and not limiting, illustrates an IC in accordance with one embodiment FIG. 2, meant to be illustrative and not limiting, illustrates a frequency divider circuit in accordance with one embodiment.

FIG. 1, meant to be illustrative and not limiting, illustrates an IC in accordance with one embodiment. IC 100 includes core region 110 and transceiver blocks 120. Core region 110 may include a plurality of circuits that performs different functions. In one embodiment, IC 100 may be a programmable logic device (PLD) and core region 110 may include a plurality of programmable logic elements (LEs), and, in some instances, may further include memory elements.

Transceiver blocks 120 are located at the two opposing edges of IC 100 in this exemplary embodiment. It should be appreciated that transceiver blocks 120 may be placed at different locations within IC 100 depending on circuit designs. Each transceiver block 120 may include a plurality of transceivers 120[0]-120[n]. In one embodiment, 'n' may be an integer value, e.g., 1, 2, etc. A portion of the plurality of transceivers 120[0]-120 [n] may be capable of transmitting signals to and from IC 100, according to one embodiment. It should be appreciated that the signals may be input/output (I/O) signals.

In one embodiment, the plurality of transceivers 120[0]-120[n] may be able to operate at different frequencies. Therefore, the plurality of transceivers 120[0]-120[n] may be able to receive or transmit signals across a wide spectrum of frequencies. In one embodiment, transceivers 120[0]-120[n] may be adapted dynamically to receive or transmit signals at various frequencies. Hence, the plurality of transceivers 120[0]-120[n] may receive/transmit a signal at a first frequency in one instance and may receive/transmit another signal at second frequency in another instance.

In one embodiment, a portion of the plurality of transceivers 120[0]-120[n] may further include clock and data recovery (CDR) circuits or phase lock loop (PLL) circuits. The CDR, together with the PLL, may generate a clock signal based on the incoming data. It should be appreciated that the generated clock signal may have a frequency similar to the frequency of the incoming data.

Figure 2:
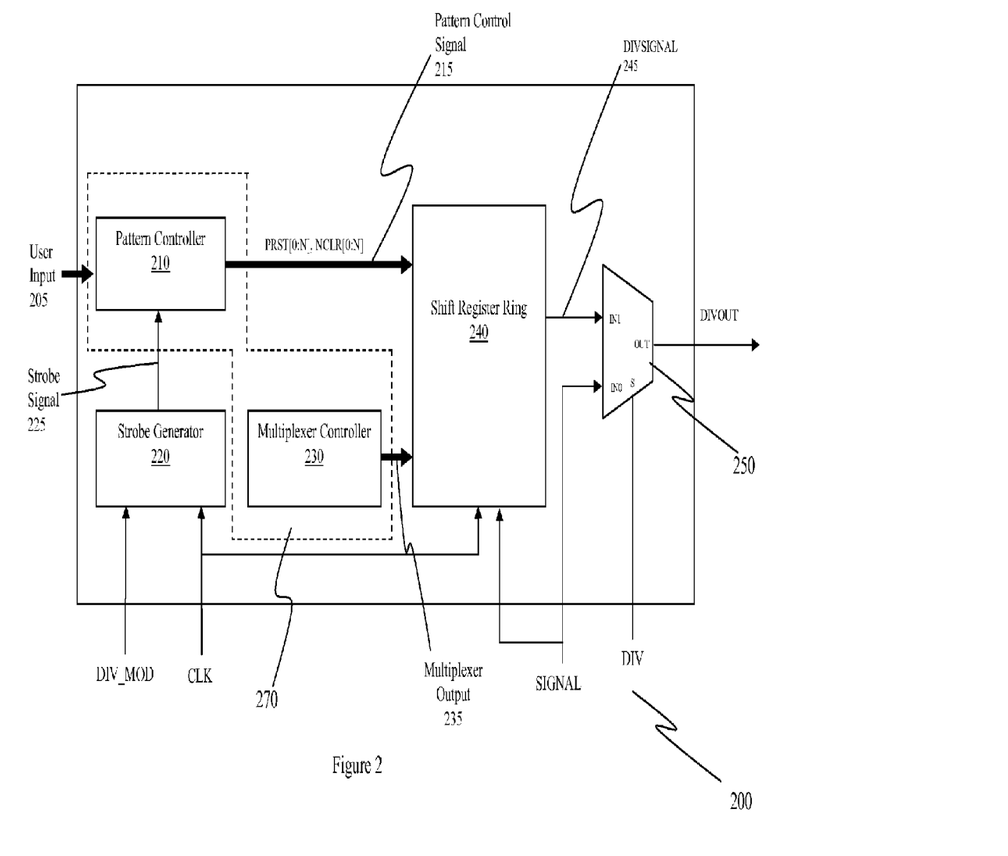

In one embodiment, a PLL/CDR may include frequency divider circuit 200. Frequency divider circuit 200 divides the frequency of a signal from a first frequency to a second frequency. In one embodiment, the second frequency may be lower than the first frequency. It should be appreciated that the purpose of dividing the frequency to a signal that has low frequency may be to enable signal processing by the remaining circuitry within the PLL/CDR or remaining circuitry of IC 100, which operates at a significantly lower frequency in comparison to the operating frequency of transceiver 120 [0]-120[n]. In one embodiment, some of the plurality of transceivers 120[0]-120[n] in IC 100 may have a different divisional factor from each other because they may receive signals with different frequency. It should be appreciated that each PLL/CDR circuits may include one or more frequency divider circuit 200.

FIG. 2, meant to be illustrative and not limiting, illustrates a frequency divider circuit in accordance with one embodiment. In the embodiment of FIG. 2, frequency divider circuit 200 includes pattern controller 210, multiplexer controller 230, shift register ring 240, strobe generator 220 and multiplexer 250. Frequency divider circuit 200 may be part of a transceiver circuit, e.g., transceivers 120[0]-120[n], in one instance, as illustrated in FIG. 1.

In one exemplary embodiment, frequency divider circuit 200 may receive an input signal (e.g., SIGNAL), a clock signal (e.g., CLK), a divisional mode signal (e.g., DIV_MOD), an output control signal (e.g., DIV), and a user input signal. Frequency divider circuit 200 may also generate an output signal (e.g., DIVOUT). It should be appreciated that input signal, SIGNAL, may be transmitted to frequency divider circuit 200 from a signal source (e.g., a transceiver circuit, an I/O block, etc). The output signal from frequency divider circuit 200, DIVOUT, may be transmitted to other circuitry within the PLL/CDR.

In the embodiment of FIG. 2, frequency divider circuit 200 includes pattern controller 210 and multiplexer controller 230 that forms control logic block 270. In an exemplary embodiment, control logic block 270 controls the operations of shift register ring 240 to generate a frequency-divided signal. In this exemplary embodiment, pattern controller 210 is coupled to shift register ring 240 and strobe generator 220. Pattern controller 210 receives two input signals, e.g., strobe signal 225 and user input 205. Pattern controller 210 may output pattern control signal 215 based on the two input signals. Pattern control signal 215 may be transmitted to shift register ring 240 for controlling the manner in which to divide the frequency of a signal. It should be appreciated that pattern control signal 215 may determine the state in which a shift register within shift register ring 240 may be programmed.

Pattern control signal 215 may be utilized for programming a particular frequency divisional factor in shift register ring 240. Therefore, pattern control signal 215 may also be known as a frequency divider pattern. In one embodiment, pattern control signal 215 may include an array of bits. In the embodiment of FIG. 2, pattern control signal 215 is formed by two arrays of bits (e.g., PRST [0:N] and NCLR [0:N]). Additional details of shift register ring 240 and pattern control signal 215 that is formed by arrays PRST[0:N] and NCLR[0:N] will be shown and discussed in connection with FIG. 5A.

Still referring to FIG. 2, shift register ring 240 is also coupled to multiplexer controller 230. Multiplexer controller 230 may generate multiplexer output 235 to control the propagation of the SIGNAL through the shift registers within shift register ring 240. In one embodiment, multiplexer output 235 may be generated based on user input 205. The output from multiplexer 230 may be based on a particular frequency divisional factor. In one embodiment, the output may be an array of bits. Each bit within the array may control a corresponding multiplexer (not shown) that may be coupled between two consecutive shift registers within shift register ring 240.

In one embodiment, multiplexer controller 230 may be formed by an array of storage elements. The storage elements may include memory elements, e.g., Static Random Access Memory (SRAM) elements, Dynamic Random Access Memory (DRAM) elements, etc. It should be appreciated that the number of storage elements that form multiplexer controller 230 may be proportional to the size of outputted array bits, which forms multiplexer output 235.

Shift register ring 240, according to one embodiment, may be used to divide the frequency of a signal (e.g., input signal 205) to generate divided frequency signal, i.e., DIVSIGNAL 245. In the embodiment of FIG. 2, shift register ring 240 is coupled to pattern controller 210, multiplexer controller 230 and multiplexer 250. Apart from receiving pattern control signals 215 from pattern controller 210 and multiplexer output 235 from multiplexer 230, shift register ring 240 also receives two other input signals (e.g., SIGNAL and CLK). Shift register ring 240 transmits its output, i.e., DIVSIGNAL 245, to multiplexer 250.

In one embodiment, shift register ring 240 includes a plurality of shift registers. The shift registers may be coupled together to form a ring structure. Pattern control signal 215 may be utilized to control the shift registers based on different frequency divisional factors. Additional details of shift register ring 240 will be shown and described in connection with FIG. 5A.

Still referring to FIG. 2, strobe generator 220 is coupled to pattern controller 210. Strobe generator 220 may be coupled to receive two signals (e.g., DIV_MOD and CLK). In one embodiment, one of the input signals received by strobe generator 220, DIV_MOD, may be an enabling signal. Accordingly, DIV_MOD may be set to a logic high (or a logic low) value when a division operation is initiated in frequency divider circuit 200. In one embodiment, strobe generator 220 outputs strobe signal 225 based on the CLK signal and DIV_MOD signal. Strobe signal 225 may be a trigger signal for frequency divider circuit 200 to perform the divisional process on the SIGNAL. It shall be appreciated that the strobe generator 220 may not be needed if an external circuit provides a trigger signal to initiate the divisional process.

Still referring to FIG. 2, multiplexer 250 may be coupled to the shift register ring 240. Multiplexer 250 may be coupled to receive two inputs, e.g., SIGNAL and DIVSIGNAL. In one embodiment, multiplexer 250 may be operable to transmit either one of the two inputs, SIGNAL or DIVSIGNAL, as an output, DIVOUT. In the embodiment of FIG. 2, multiplexer 250 may be controlled by a select input, e.g., DIV. It should be appreciated that DIV may be a signal that controls which of the two inputs, SIGNAL and DIVSIGNAL, to be transmitted as an output, DIVOUT.

Figure 3A:
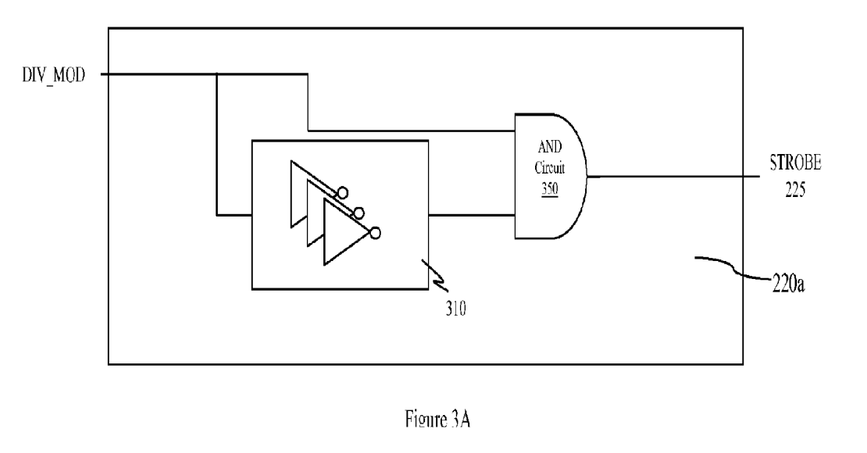
FIG. 3A, meant to be illustrative and not limiting, illustrates an asynchronous strobe generator in accordance with one embodiment.

FIG. 3A, meant to be illustrative and not limiting, illustrates an asynchronous strobe generator in accordance with one embodiment. Strobe generator 220a is a more detailed representation of strobe generator 220 of FIG. 2 except that the strobe generator 220a does not receive the CLK signal. In the embodiment of FIG. 3A, strobe generator 220a may include a delay circuit 310 and AND circuit 350. In one embodiment, the delay circuit 310 may be formed by a plurality of inverters coupled in series. In an exemplary embodiment, delay circuit 310 may include an odd number of inverters.

In the embodiment of FIG. 3A, the strobe generator 220a receives an enable signal, i.e., DIV_MOD, and outputs a signal, i.e., STROBE 225, based on the received enable signal. In an exemplary embodiment, DIV_MOD may be at logic low level when a division operation is not needed. As such, according to one embodiment, AND circuit 350 will output a logic low value when DIV_MOD is at a logic low level.

When a division operation is initiated, DIV_MOD switches from a logic low value to a logic high value, according to one embodiment. As such, due to the presence of delay circuit 310, AND circuit 350 may receive a logic high value at both its input terminals for a relatively short period. Therefore, during that brief period, the output of AND circuit 350, STROBE 225, may be at a logic high value. In one embodiment, the brief period may be approximately 1~5 ns. However, after the brief period, delay circuit 310 may output an inverted version of DIV_MOD, e.g., a logic low value. Consequently, after a brief period of time, the AND circuit 350 may receive two complementary values. It should be appreciated that a logic high value may be transmitted as an output, STROBE 225, of strobe circuit 220a. It should be appreciated that the duration which the strobe signal, STROBE, is at logic high level depends on the number of inverters within the delay circuit 310.

Figure 3B:
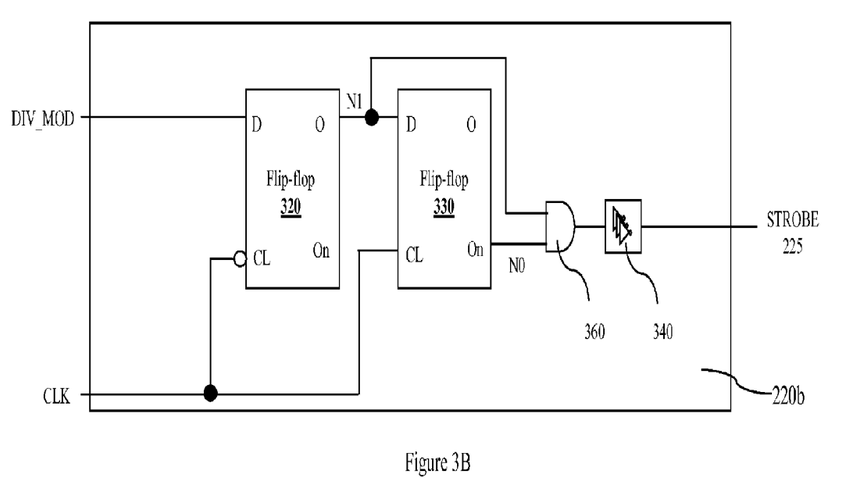
FIG. 3B, meant to be illustrative and not limiting, illustrates a synchronous strobe generator in accordance with one embodiment.

FIG. 3B, meant to be illustrative and not limiting, illustrates a synchronous strobe generator in accordance with one embodiment. In the embodiment of FIG. 3B, strobe generator 220b includes flip-flops 320 and 330, an AND gate 360 and a delay circuit 340. The inputs to flip-flop 320 may be DIV_MOD signal and CLK signal. In the embodiment of FIG. 3B, the output of flip-flop 320 is coupled to flip-flop 330. The output (e.g., N1) from output terminal (Q) of the flip-flop 320 is transmitted to the input terminal (D) of flip-flop 330. Flip-flop 330 generates an output (e.g., N0) at output terminal (Qn). It should be appreciated that output terminal Qn is complementary to output terminal Q for a flip-flop circuit. The AND circuit 360 receives the output, N1, of flip-flop 320 as one of its inputs and the N0 signal from flip-flop 330 as another of its input. The resultant output from the AND circuit 360 is coupled to the delay circuit 340. The resultant output may be a strobe signal before an added delay, in one embodiment. In one embodiment, the delay circuit 340 may be programmable and the duration of the strobe signal may be adjusted.

Figure 3C:
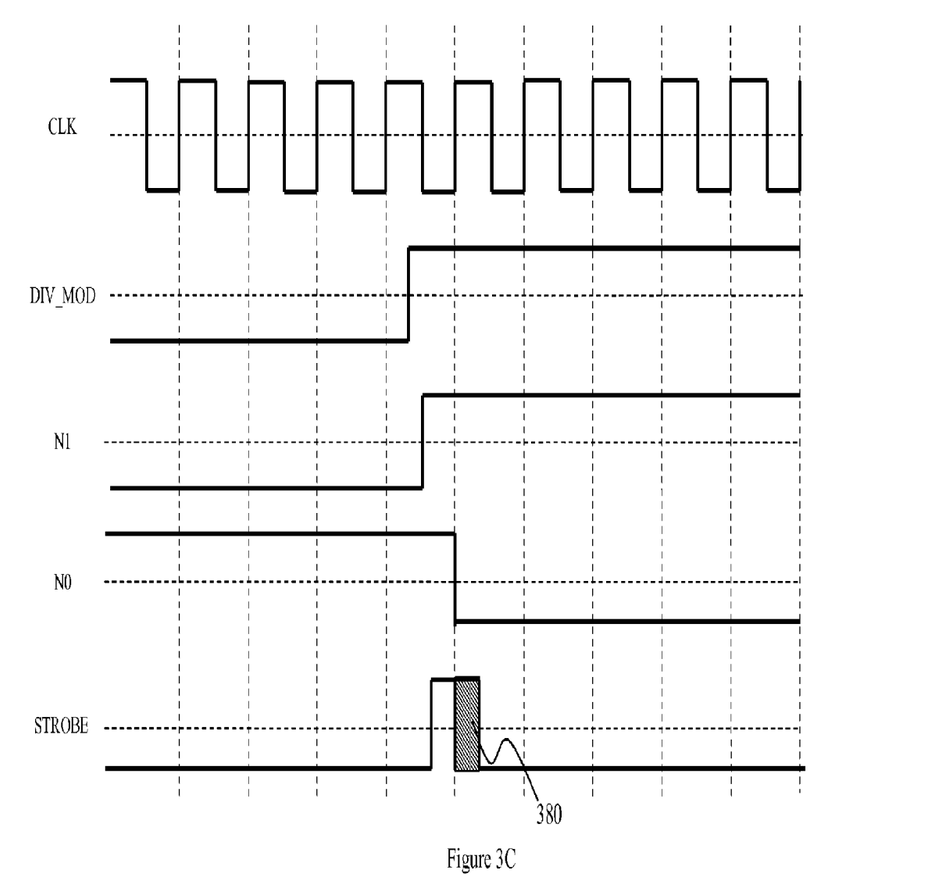
FIG. 3C, meant to be illustrative and not limiting, illustrates a timing diagram of a strobe signal generated by the synchronous strobe generator in accordance with one embodiment.

FIG. 3C, meant to be illustrative and not limiting, illustrates a timing diagram of a strobe signal generated by a synchronous strobe generator in accordance with one embodiment. In one embodiment, the strobe signal may be generated by synchronous strobe generator 220b of FIG. 3B. When DIV_MOD is at a logic low level, N1 may be at a logic low level and N2 may be at a logic high level. When DIV_MOD switches from the logic low value to the logic high value, N1 may switch from the logic low value to the logic high value on a next falling edge of the clock signal, CLK. It should be appreciated that the output of flip-flop 320 of FIG. 3b, N1, may be flipped at a falling edge of the clock signal, CLK as the CLK input terminal of flip-flop 320 is an active-low input terminal.

The output of flip-flop 330 of FIG. 3, N0, may switch from the logic high value to the logic low value at a next rising edge of the clock signal, CLK. When both signals, N0 and N1, are at a logic high level, the strobe signal, STROBE, will be at a logic high level, according to one embodiment. In the embodiment of FIG. 3C, the duration of the logic high level of strobe signal, STROBE, may be adjustable by a delay circuit similar to the delay circuit 340 of FIG. 3B. In the embodiment of FIG. 3, the duration of the logic high level of STROBE may be extended by approximately a quarter of a clock cycle, as represented by shaded region 380.

Figure 4:
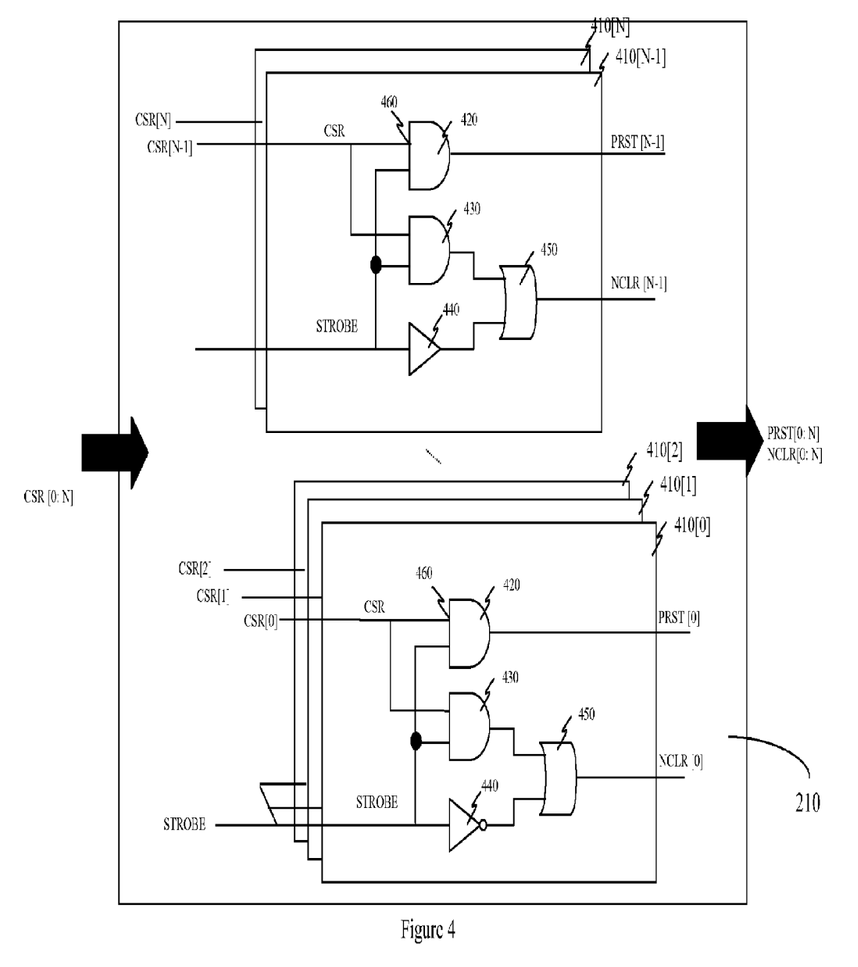
FIG. 4, meant to be illustrative and not limiting, illustrates a pattern controller in accordance with one embodiment.

FIG. 4, meant to be illustrative and not limiting, illustrates a detailed representation of pattern controller 210 in accordance with one embodiment. In an exemplary embodiment, pattern controller 210 may include a plurality of combinational logic circuits 410[0]-410[N]. Each combinational logic circuit 410[0]-410[N] may further include a plurality of logic gates. In one embodiment, each of combinational logic circuits 410[0]-410[N] may include AND gates 420 and 430, an OR gate 450 and an inverter 440. In another embodiment, one or more combinational logic circuits 410 [0]-410[N] may have a different logic circuitry.

It should be appreciated that combinational logic circuits 410[0]-410[N] may be formed within core region 110 of FIG. 1. In one embodiment, combinational logic circuits 410[0]-410[N] may be formed by a plurality of programmable LEs within a PLD.

Still referring to FIG. 4, each combinational logic slice 410[0]-410[N] may receive a user defined input (e.g., CSR). Furthermore, each combinational logic circuit 410[0]-410 [N] may also receive a strobe signal, e.g., STROBE, from a strobe generator circuit, e.g., strobe generator 220 of FIG. 2.

It should be appreciated that each CSR bit from the array of CSR bits, CSR [0:N] may be coupled to CSR input 460 of AND gate 420. For instance, the first CSR bit, CSR[0], may be coupled to CSR input 460 of combinational logic circuit 410a; the second CSR bit, CSR[1], may be coupled CSR input 460 of combinational logic circuit 410b; and so on. Each combinational logic circuit of the plurality of combinational logic circuits 410[0]-410[N] may output two bits, e.g., Preset (PRST) bit and Not Clear (NCLR) bit as pattern control signals. In one embodiment, combinational logic circuits 410[0]-410[N] may collectively generate two bit arrays, e.g., NCLR [0:N] and PRST [0:N].

In one embodiment, the PRST bit may preset a shift register to a specific logic value, e.g., logic value 1, while the NCLR bit may clear a corresponding shift register in a shift register ring, e.g., shift register ring 240 of FIG. 2. It should be appreciated that NCLR [0:N] and PRST [0:N], may include 'N+1' elements within the array. Accordingly, there may be a total of N+1 shift registers within shift register ring 240 of FIG. 2. Therefore, combinational logic circuits 410 [0]-410[N] may be operable to control the inputs transferred to the respective shift register within the shift register ring, which will be discussed in detail in FIG. 5A.

In one embodiment, when the strobe signal, STROBE, is at a logic low level, each of combinational logic circuits 410[0]-410[N] may output a logic low level for a corresponding PRST and a logic high level for a corresponding NCLR bit. When the strobe signal, STROBE, is at a logic high level and a corresponding CSR bit is at a logic low level, the corresponding combinational logic circuit may output a logic low level for the corresponding PRST and NCLR bits. In one embodiment, when an NCLR bit is at a low logic level, its corresponding shift register in the shift register ring may be cleared.

When the strobe signal, STROBE, is at a logic high level and the corresponding CSR bit is at a logic high level, the corresponding combinational logic circuit may generate a logic high value for the corresponding PRST and NCLR bits. In an exemplary embodiment, when a PRST bit is at a logic high value, its corresponding shift register in the shift register ring may be preset to a certain logic level, e.g., a logic high level.

Table 1 below illustrates the CSR [0:9] inputs that may generate the divisional factor, ranging from 1-10, when the STROBE logic is '1', based on this exemplary embodiment.

Figure 5A:
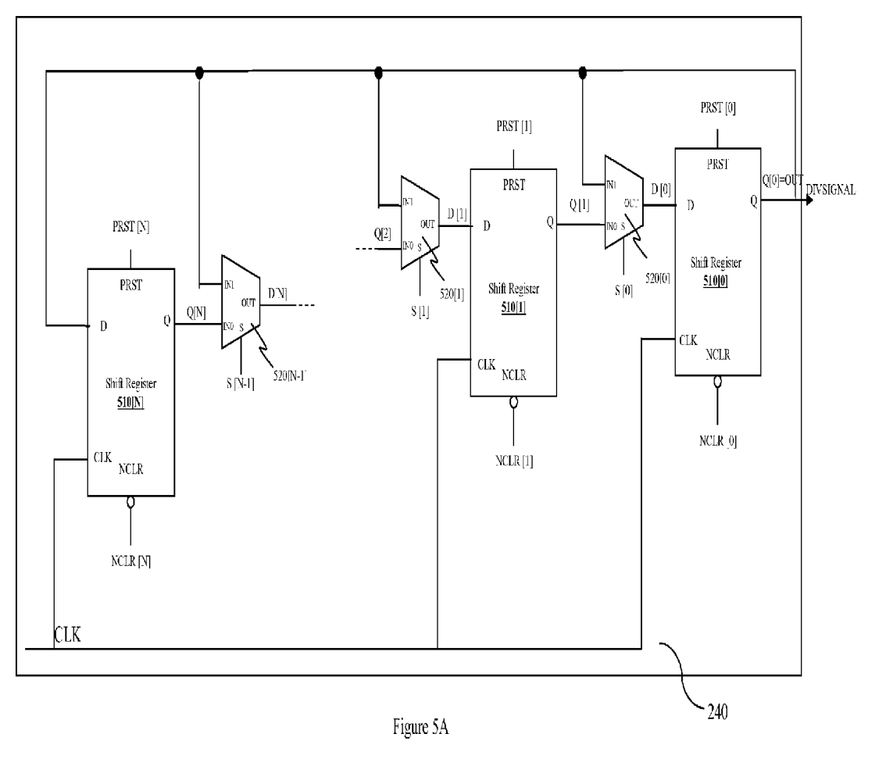
FIG. 5A, meant to be illustrative and not limiting, illustrates a shift register ring in accordance with one embodiment.

FIG. 5A, meant to be illustrative and not limiting, illustrates a detailed representation of a shift register ring in accordance with one embodiment. In the embodiment of FIG. 5A, shift register ring 240 includes a plurality of shift registers 510[0]-510[N] and a plurality of multiplexers 520 [0]-520[N-1]. In one embodiment, shift register ring 240 is capable of dividing an input signal by up to a divisional factor of N+1. In one exemplary embodiment, shift register ring 240 may have ten different divisional factors, e.g., 1, 2, 3 . . . 10. Accordingly, there may be a total of 10 shift registers within shift register ring 240.

Still referring to FIG. 5A, shift registers 510[0]-510[N] may be coupled to a plurality of multiplexers 520[0]-520 [N-1]. In one embodiment, each multiplexer from the plurality of multiplexers 520[0]-520[N-1] may be placed between two shift registers. For instance, multiplexer 520[0] may be placed between shift registers 510[0] and 510[1], multiplexer 520[1] may be placed between shift registers 510[1] and 510[2] (not shown), and so on. It should be appreciated that there may be a total of N number of multiplexers in shift register ring 240 with a total of N+1 shift registers. The right-most shift register, e.g., shift register 510[0], may generate an output, DIVSIGNAL, for shift register ring 240.

In the embodiment of FIG. 5A, each shift register 510 [0]-510[N] may include four different input terminals, e.g., PRST, NCLR, data (D), and clock (CLK), and an output terminal, e.g., Q. In one embodiment, the inputs received at input terminals PRST and NCLR are from pattern controller 210 of FIG. 4. Input terminal PRST may receive a corresponding PRST bit from the PRST [0:N] array, and input terminal NCLR may receive a corresponding NCLR bit from the NCLR [0:N] array. Therefore, in one exemplary embodiment, shift register 510[0] receives input bits PRST [0] and NCLR[0]; shift register 510[1] receives input bits PRST[0] and NCLR[0]; and so on with shift register 510[N] receiving input bits PRST[N] and NCLR[N].

TABLE 1

| Divisional Factor | CSR[0] | CSR[1] | CSR[2] | CSR[3] | CSR[4] | CSR[5] | CSR[6] | CSR[7] | CSR[8] | CSR[9] |
|---|---|---|---|---|---|---|---|---|---|---|
| 1 | 0 | 0 | 0 | 0 | 0 | 0 | | | | |
| 2 | 1 | 0 | 0 | 0 | 0 | 0 | 0 | 0 | 0 | 0 |
| 3 | 1 | 1 | 0 | 0 | 0 | 0 | 0 | 0 | 0 | 0 |
| 4 | 1 | 1 | 0 | 0 | 0 | 0 | | | | |
| 5 | 1 | 1 | 1 | 0 | 0 | 0 | 0 | 0 | 0 | 0 |
| 6 | 1 | 1 | 1 | 0 | 0 | 0 | 0 | 0 | 0 | 0 |
| 7 | 1 | 1 | 1 | 1 | 0 | 0 | 0 | 0 | 0 | 0 |
| 8 | 1 | 1 | 1 | 1 | 0 | 0 | 0 | 0 | 0 | 0 |
| 9 | 1 | 1 | 1 | 1 | 1 | 0 | 0 | 0 | 0 | 0 |
| 10 | 1 | 1 | 1 | 1 | 1 | 0 | 0 | 0 | 0 | 0 |

Table 1 illustrates the CSR [0:9] bits that is needed to obtain a respective frequency divisional factor, in one exemplary embodiment. The manner in which such frequency divisional factor may be achieved will be described through FIG. 5A.

It should be appreciated that the CSR [0:N] array received at the pattern controller 210 may be static inputs or dynamic inputs (e.g., inputs that vary according to time). In one embodiment, a static CSR [0:N] array may be utilized to obtain an integer divisional factor. In another embodiment, a dynamic CSR [0:N] array may be utilized to obtain a fractional divisional factor. It should be appreciated that the dynamic CSR [0:N] array may be received from a dynamic partial reconfigurable input/output (DPRIO) that allows inputs to be varied periodically.

In the embodiment of FIG. 5A, input terminal (D) of shift register 510[0] receives input bit D[0], input terminal (D) of shift register 510[1] receives input bit D[1], and so on, up to input terminal (D) of shift register 510[N]. Accordingly, output terminal (Q) of shift register 510[0] outputs Q[0], output terminal (Q) of shift register 510[1] outputs Q [1] and so on, up to output terminal (Q) of shift register 510[N]. It should also be appreciated that the bits of the NCLR [0:N] array may be inverted before being coupled to their respective shift registers 510[0]-510[N].

Still referring to FIG. 5A, each multiplexer 520[0]-520 [N-1] may include two input terminals, e.g., terminals IN0 and IN1, a control input terminal, e.g., terminal S, and an output terminal, e.g., terminal OUT. It should be appreciated that terminal IN0 may be coupled to the output Q from a preceding shift register. In one exemplary embodiment, terminal IN0 of multiplexer 520[0] receives output Q [1] from shift register 510b. Terminal IN1 of each multiplexer 520[0]-520[N−1] may receive a feedback input signal, e.g., output Q [0], from shift register 510[0].

Terminal OUT of each multiplexer 520[0]-520[N−1] may transmit a corresponding data bit to an adjacent shift register, e.g., output D[0] of multiplexer 520[0] is coupled to shift register 510[0], output D[1] of multiplexer 520[1] is coupled to shift register 510[1], and so on such that output D[N] of multiplexer 520[N−1] is coupled to shift register 510[N−1] (not shown).

Still referring to FIG. 5A, the control input terminal (S) of each multiplexer 520[0]-520[N−1] may be coupled to the output of multiplexer controller 230 of FIG. 2. In one embodiment, the output from multiplexer controller 230 may be an array of select bits, e.g., S [0:N−1]. In this exemplary embodiment, the first bit, S [0], is coupled to the control input terminal (S) of multiplexer 520[0], the second bit, S [1], is coupled to the control input terminal (S) of multiplexer 520[1], and so on. It should be appreciated that the signal, or select bit, received at the control input terminal (S) of each of multiplexers 520[0]-520[N−1] determines whether the signal at input terminal IN0 or the signal at input terminal IN1 is transmitted as an output. In one exemplary embodiment, when the control input terminal (S) receives a logic low value, e.g., logic value 0, the signal at input terminal IN0 is transmitted to the output terminal, OUT, of a corresponding multiplexer 520[0]-520[N−1]. When the control input terminal (S) receives a logic high value, e.g., logic value 1, the signal at input terminal IN1 is transmitted to the output terminal, OUT, of a corresponding multiplexer 520[0]-520[N−1].

Still referring to FIG. 5A, shift register ring 240 may be configured to one of the frequency divisional factors through multiplexers 520[0]-520[N−1]. In one embodiment, multiplexers 520[0]-520[N−1] may receive a predetermined binary sequence in the S[0:N−1] array to place shift registers 510[0]-510[N] into different states, e.g., PRESET and CLEAR. Table 2 below shows the different configurable states and the settings the respective shift registers 510[0]-510[9] within shift register ring 240.

PRESET state when it receives a logic high value, e.g., logic value 1. Accordingly, shift registers 510[0]-510[9] may be placed in a CLEAR state when a low logic value, e.g., logic value 0, is received. In one embodiment, shift registers 510[0]-510[N] may transmit a logic high value when in the PRESET state and a logic low value when in the CLEAR state. It should be appreciated that any of the shift registers 510[0]-510[N] may be marked as not available, NA, when it is not active.

In one embodiment, the states of shift registers 510[0]-510[N] may be altered after a predefined cycle. It should be appreciated that a fractional divisional factor may be obtained by configuring and altering the states of shift registers 510[0]-510[N]. In one embodiment, the predefined cycle may include one or more clock cycles.

TABLE 3

| Average divisional factor = 2.5 | | |
|---|---|---|
| Cycle | Divisional factor | Output Q[0] |
| 1 | 2 | 10 |
| 2 | 3 | 110 |
| Average value | 2.5 | 10110 |

In one exemplary embodiment, to obtain a divisional factor of 2.5, shift registers 510[0] and 510[1] may be configured with a frequency divisional factor of 2 during a first clock cycle. Shift registers 510[0], 510[1] and 510[2] may be configured with a frequency divisional factor of 3 during a second clock cycle. The resultant frequency divisional factor is the average between the two frequency divisional factors (2 and 3), or 2.5, according to one embodiment. Table 3 also shows the resulting output Q[0] of a frequency divided by a fractional divisional factor of 2.5. It should be appreciated that the total number CLK cycles required to obtain a fractional divisional factor of 2.5 is five CLK cycles, as illustrated by the five-bit output of Q[0], 10110. In an exemplary embodiment, different frequency

TABLE 2

| Divisional Factor | 510[0] | 510[1] | 510[2] | 510[3] | 510[4] | 510[5] | 510[6] | 510[7] | 510[8] | 510[9] |
|---|---|---|---|---|---|---|---|---|---|---|
| 1 | NA | NA | NA | NA | NA | NA | NA | NA | NA | NA |
| 2 | 1 | 0 | NA | NA | NA | NA | NA | NA | NA | NA |
| 3 | 1 | 1 | 0 | NA | NA | NA | NA | NA | NA | NA |
| 4 | 1 | 1 | 0 | 0 | NA | NA | NA | NA | NA | NA |
| 5 | 1 | 1 | 1 | 0 | 0 | NA | NA | NA | NA | NA |
| 6 | 1 | 1 | 1 | 0 | 0 | 0 | NA | NA | NA | NA |
| 7 | 1 | 1 | 1 | 1 | 0 | 0 | 0 | NA | NA | NA |
| 8 | 1 | 1 | 1 | 1 | 0 | 0 | 0 | 0 | NA | NA |
| 9 | 1 | 1 | 1 | 1 | 1 | 0 | 0 | 0 | 0 | NA |
| 10 | 1 | 1 | 1 | 1 | 1 | 0 | 0 | 0 | 0 | 0 |

In one embodiment, Table 2 shows how each of the shift registers 510[0]-510[9] may be configured for a particular frequency divisional factor. It should be appreciated that any one of shift registers 510[0]-510[9] may be placed in a divisional factors may be obtained by controlling the select bits, represented by S [0:9] array, of the different multiplexers, e.g., multiplexers 520[0]-520[9], as shown in Table 4 below.

TABLE 4

| Divisional Factor | S[0] | S[1] | S[2] | S[3] | S[4] | S[5] | S[6] | S[7] | S[8] | S[9] |
|---|---|---|---|---|---|---|---|---|---|---|
| 1 | NA | NA | NA | NA | NA | NA | NA | NA | NA | NA |
| 2 | 0 | 1 | NA | NA | NA | NA | NA | NA | NA | NA |

TABLE 4-continued

| Divisional Factor | S[0] | S[1] | S[2] | S[3] | S[4] | S[5] | S[6] | S[7] | S[8] | S[9] |
|---|---|---|---|---|---|---|---|---|---|---|
| 3 | 0 | 0 | 1 | NA | NA | NA | NA | NA | NA | NA |
| 4 | 0 | 0 | 0 | 1 | NA | NA | NA | NA | NA | NA |
| 5 | 0 | 0 | 0 | 0 | 1 | NA | NA | NA | NA | NA |
| 6 | 0 | 0 | 0 | 0 | 0 | 1 | NA | NA | NA | NA |
| 7 | 0 | 0 | 0 | 0 | 0 | 0 | 1 | NA | NA | NA |
| 8 | 0 | 0 | 0 | 0 | 0 | 0 | 0 | 1 | NA | NA |
| 9 | 0 | 0 | 0 | 0 | 0 | 0 | 0 | 0 | 1 | NA |
| 10 | 0 | 0 | 0 | 0 | 0 | 0 | 0 | 0 | 0 | 1 |

It should be appreciated that each select bit may be used to control specific multiplexer. For instance, select bit S [0] may be used to control multiplexer 520[0], select bit S [1] may be used to control multiplexer 520[1], etc. As shown in Table 4, each multiplexer may be coupled to receive a logic low value or a logic high value, e.g., logic value 0 or 1, for different divisional factors. In some instances, at least some of the multiplexers may not be used, which is represented by not available 'NA'. In one exemplary embodiment, to obtain a frequency divisional factor of 2, only multiplexers 520[0] and 520[1] are activated, whereas the remaining multiplexers, 520[2]-520[N-1], are not activated. In one embodiment, to obtain a divisional factor of 2, two shift registers, 510[0] and 510[1]; and two multiplexers, 520[0] and 520[1] may be activated. In this embodiment, the output, Q [0], may be looped back to the input terminal IN1 of multiplexer 520[1]. In the exemplary embodiment of Table 4, the most significant bit of the used bits within the control input array, S[0:N-1], may be set to a logic high value, e.g., logic value 1, while the remaining used bits may be set to a logic low value, e.g., logic value 0.

Figure 5B:
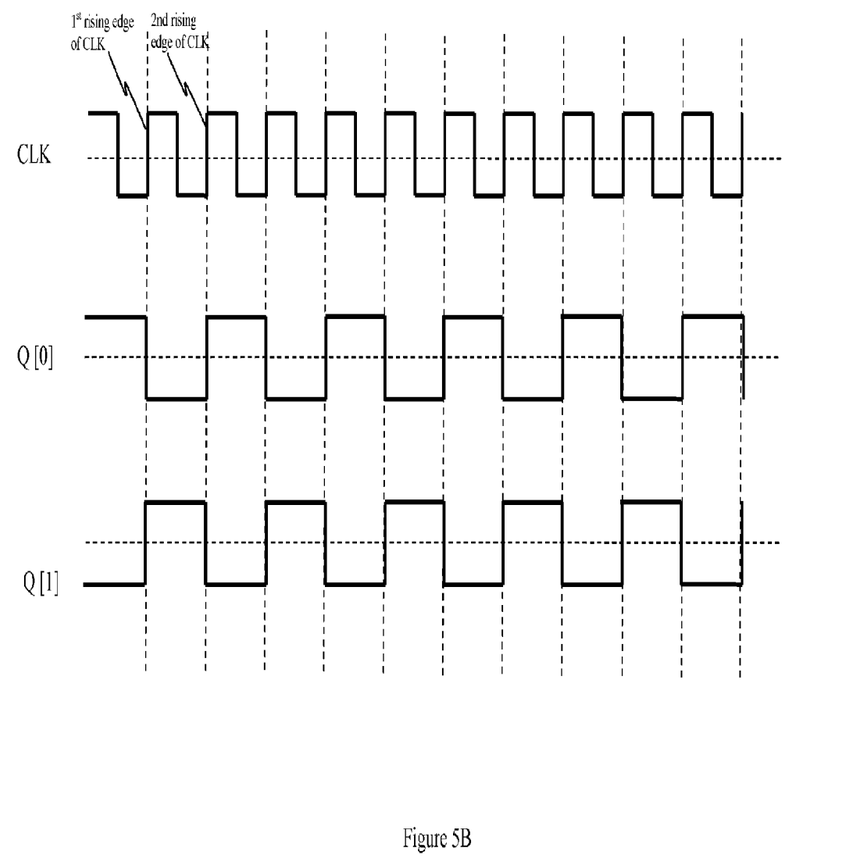
FIG. 5B, meant to be illustrative and not limiting, shows an output resulting from the division factor of two in accordance with one embodiment.

FIG. 5B, meant to be illustrative and not limiting, shows the waveform of two output bits after a division operation with a division factor of 2 in accordance with one embodiment. In the embodiment of Table 4, multiplexers 520[0] and 520[1] of FIG. 5A may be activated when performing a division operation with a division factor of 2. In the embodiment of FIG. 5A, output Q [1] of shift register 510[1] is transmitted to the input terminal, IN0, of multiplexer 520[0] and output Q [0] of shift register 510[0] is transmitted to input terminal IN0 of multiplexer 520[1]. According to Table 2, shift register 510[0] may be placed in the PRESET state and shift register 510[1] may be placed in the CLEAR state.

In the embodiment of FIG. 5B, at the first rising edge of the clock signal, CLK, output Q [0] may transition to a logic low level while output Q[1] may transition to a logic high level. At the second rising edge of the clock signal, CLK, shift register 510[0] outputs the input D [0] assigned to shift register 510[0], which would be the logical value of '1' from the output Q [1]. Shift register 510[1] outputs the input D [1] assigned to shift register 510[1], which would be logical value of '0' from the output Q [0]. As the output Q [0] varies at the rising edge of the CLK cycle, the frequency of the CLK cycle is halved, which includes an output that undergoes the divisional factor 2.

Figure 6:
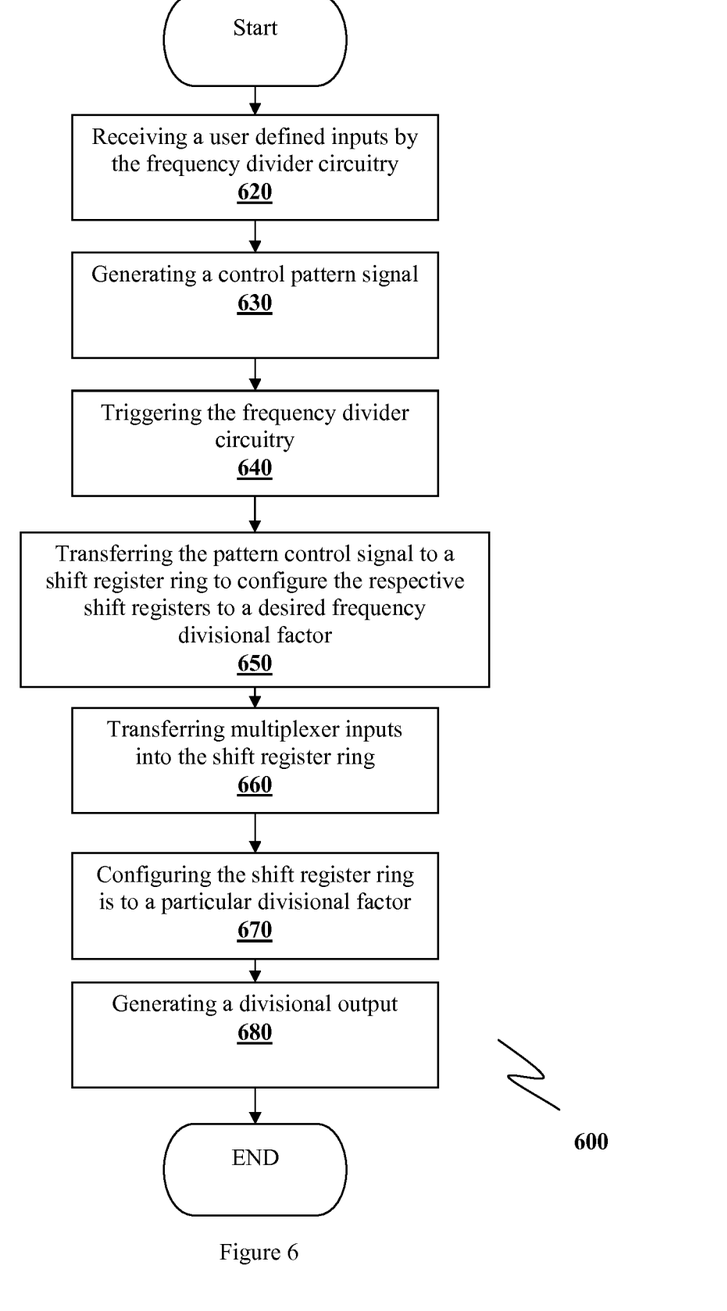
FIG. 6, meant to be illustrative and not limiting, illustrates a flowchart on a method of frequency dividing in accordance with one embodiment.

FIG. 6, meant to be illustrative and not limiting, illustrates a method of dividing a frequency of a signal in accordance with one embodiment. Method 600 includes receiving a user defined inputs by the frequency divider circuitry at step 620. In one embodiment, the user defined inputs may be the user defined input array CSR [0:N] of FIG. 4. The method 600 further includes generating a control pattern signal at step 630. The control pattern signal may include an array that represents a PRESET or CLEAR state for a plurality of shift registers in a shift register ring to obtain a desired frequency divisional factor. In one embodiment, the control pattern signal may be generated by combinational logic circuits 410[0]-410[N] of FIG. 4.

When a divisional process is initiated, the frequency divider circuitry may be triggered at step 640. In the embodiment of FIG. 2, the DIV_MOD signal may be transferred to the strobe generator 220 to trigger frequency divider circuit 200. It should be appreciated that the trigger signal may be generated synchronously or asynchronously.

The method 600 further includes transferring the pattern control signal to a shift register ring to configure the shift registers within the shift register ring based on a desired frequency divisional factor at step 650. In one embodiment, the pattern control signal may be similar to PRST [0:N] and NCLR [0:N] of FIG. 5A. At step 660, multiplexer inputs are transferred to the shift register ring. In one embodiment, the multiplexer inputs may be a plurality of select bits as represented by the array S [0:N-1] of FIG. 5A.

At step 670, the shift register ring is configured to a particular divisional factor. In one embodiment, shift register ring 240 of FIG. 2 may be configured according to Table 2. A divided output may be generated by the frequency divider at step 680. In one embodiment, the divided output may be the DIVSIGNAL of FIG. 2.

Figure 7:
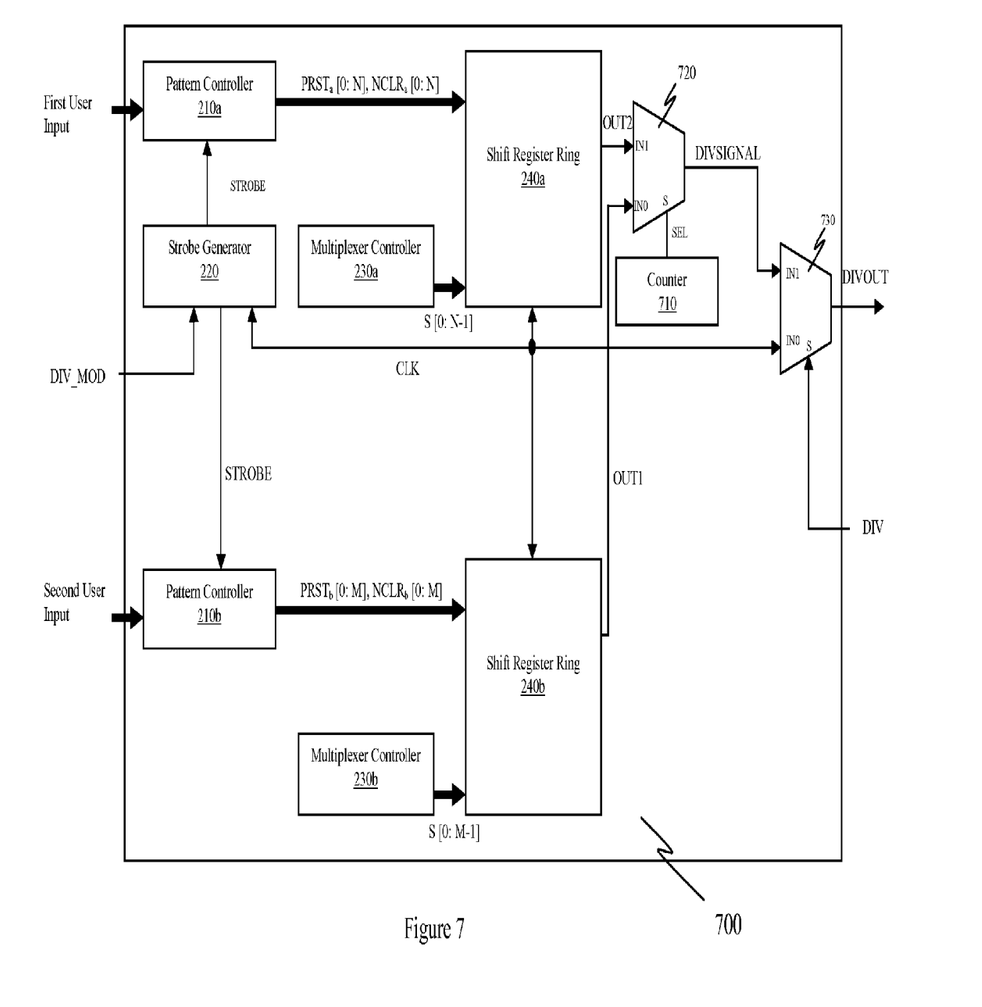
FIG. 7, meant to be illustrative and not limiting, illustrates a modified frequency divider in accordance with one embodiment.

FIG. 7, meant to be illustrative and not limiting, illustrates a frequency divider circuit in accordance with one embodiment. Frequency divider circuit 700 includes pattern controllers 210a and 210b, multiplexer controllers 230a and 230b and shift register rings 240a and 240b. Frequency divider circuit 700 further includes strobe generator 220, counter 710 and multiplexers 720 and 730.

It should be appreciated that pattern controllers 210a and 210b, multiplexer controllers 230a and 230b, shift register rings 240a and 240b and strobe generator 220 may be similar to pattern controller 210, multiplexer controller 230, shift resister ring 240, and strobe generator 220, respectively, of FIG. 2. The input to pattern controller 210a may be a first user input and the input to pattern controller 210b may be a second user input. In one embodiment, the first user input and the second user input may be different.

Outputs from pattern controller 210a may be arrays $PRST_a$ [0:N] and $NCLR_a$ [0:N], and outputs from pattern controller 210b may be arrays $PRST_b$ [0:M] and $NCLR_b$ [0:M]. The outputs from pattern controllers 210a and 210b may be utilized to configure shift register rings 240a and 240b, respectively. In one embodiment, the outputs from pattern controller 210a or 210b are according to that of Table 4. Multiplexer controller 230a may output a control signal $S_a$ [0:N-1] and multiplexer controller 230b may output another control $S_b$ [0:M-1], according to one embodiment.

In an exemplary embodiment, shift register ring 240a may be configured with the inputs $PRST_a$ [0:N], $NCLR_a$ [0:N]

and the control signal $S_a$ [0:N−1]. Accordingly, shift register ring 240b may be configured with the inputs $PRST_b$ [0:N], $NCLR_b$ [0:N], and the control input $S_b$[0:M−1]. It should be appreciated that the values of 'N' and 'M' may depend on the number of shift registers to be activated within shift register rings 240a and 240b, respectively. In one embodiment, each of shift register ring 240a and shift register ring 240b has a different divisional factor. In one embodiment, shift register 240b may transmit signal OUT1, a divided signal generated after a division operation in shift register ring 240b, to terminal IN0 of selection multiplexer 720. Accordingly, shift register 240a may transmit signal OUT2, a divided signal generated after a division operation in shift register ring 240a, to terminal IN1 of multiplexer 720.

Still referring to FIG. 7, counter 710 may select either one of the two inputs of multiplexer 720, e.g., IN1 and IN0, to be transmitted as an output, DIVSIGNAL, to terminal IN1 of multiplexer 730. In one embodiment, counter 710 may be a programmable counter. Multiplexer 720 may select one of its two inputs, IN0 and IN1, as an output based on the select bit, SEL, received from counter 710.

In one embodiment, signal OUT1 may be transmitted to multiplexer 730 when the select input, SEL, of multiplexer 720 is at a logic low value, e.g., 0. In another embodiment, signal OUT2 may be transmitted to multiplexer 730 when the select input, SEL, of multiplexer 720 is at a logic high value, e.g., 1. Counter 710 may output a static value, e.g., a logic high value (or 1), for a predefined period. In one embodiment, counter 710 may hold the signal, DIVSIGNAL, for a predefined period of time or count. It should be appreciated that multiplexer 730 may have similar functions as multiplexer 250 of FIG. 2.

It should be appreciated that frequency divider circuit 700 may be operable to divide a signal by different factors. Table 5 below shows the output Q [0] of a signal divided by a factor of 3.6 and the number of clock cycles that frequency divider circuit 700 goes through to generate a divisional factor of 3.6.

TABLE 5

Average divisional factor = 3.6

| Cycle | Divisional factor | Output Q[0] |
|---|---|---|
| 1 | 3 | 110 |
| 2 | 3 | 110 |
| 3 | 3 | 110 |
| 4 | 3 | 110 |
| 5 | 6 | 111000 |
| Average value | 3.6 | 4 |

In one embodiment, frequency divider circuit 700 requires 5 clock cycles to divide a signal by a divisional factor of 3.6. In this exemplary embodiment, shift register ring 240a may be configured with a divisional factor of 3 and shift register ring 240b may be configured with a divisional factor of 6. Both, shift register rings 240a and 240b may be programmed according to Table 4, according to one embodiment.

Counter 710 may supply a logic high value, e.g., 1, to input terminal S so that signal OUT2 will be transmitted as the output of multiplexer 720, DIVSIGNAL. In one embodiment, OUT2 may be a data pattern, e.g., 110. It should be appreciated that a three-bit data pattern such as 110 may be obtained within three clock periods. The data pattern, 110, may be repeated for 4 cycles (i.e., cycles 1-4), as illustrated in Table 5. Therefore, the output signal, DIVSIGNAL, may be 110110110110 (i.e., 110 repeated four times).

It should be appreciated that upon completion of the 4$^{th}$ cycle, i.e., at the 12$^{th}$ clock period or at the 12$^{th}$ rising edge of the clock signal, counter 710 may transmit a different signal such that signal OUT1 is selected as an output, DIVSIGNAL, at multiplexer 720. In an exemplary embodiment, counter 710 may transmit a logic low value, e.g., 0, input terminal S of multiplexer 720 so that signal OUT1 is selected as output DIVSIGNAL. In one embodiment, signal OUT1 may be another data pattern, e.g., 111000. It should be appreciated that a total of six clock periods may be needed to obtain a six-bit data pattern such as 111000.

As such, in one embodiment, the resulting output signal, i.e., DIVSIGNAL, of a signal divided by a factor of '3.6' may be 110110110110111000. In the embodiment of FIG. 7, a total of nine shift registers (three from shift register ring 240a and six from shift register ring 240b) may be needed to obtain a fractional divisional factor of 3.6. Accordingly, it should also be appreciated that frequency divider circuit 200 of FIG. 2 may be programmable to a divisional factor of 3.6 by utilizing 18 shift registers.

The embodiments, thus far, were described with respect to integrated circuits. The method and apparatus described herein may be incorporated into any suitable circuit. For example, the method and apparatus may be incorporated into numerous types of devices such as microprocessor, programmable logic devices (PLDs), application specific standard products (ASSPs) and application specific integrated circuits (ASICs). Exemplary of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the devices owned by ALTERA.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing embodiment has been described in some detail for the purposes of clarity of understanding, it will be apparent that certain changes and modifications can be practiced within the scope of the appended claims. Accordingly, the present embodiments are to be considered as illustrative and not restrictive, and the embodiment is not to be limited to the details given herein, but may be modified within the scope and equivalents of the appended claims.

The invention claimed is:

1. An integrated circuit (IC), comprising:
   a plurality of shift registers, wherein each shift register of the plurality of shift registers comprises at least a first input terminal and a second input terminal;
   a multiplexer controller that activates a subset of the plurality of shift registers within the plurality of shift registers according to a fractional divisional factor;
   a pattern controller that generates a pattern control signal that is transmitted to the plurality of shift registers, wherein the pattern control signal causes the fractional divisional factor to be applied to a frequency of an input signal, the pattern control signal comprises a first array of bits and a second array of bits, the first input terminal of each shift register receives a corresponding bit from the first array of bits, and the second input terminal of each shift register receives a corresponding bit from the second array of bits; and
   a strobe generator that generates a trigger signal that triggers the pattern controller to transmit the pattern control signal to the plurality of shift registers, wherein the corresponding bit from the first array of bits acts to set the each shift register responsive to the trigger signal, and wherein the corresponding bit from the second array of bits acts to clear the each shift register responsive to the trigger signal.

2. The IC in claim 1, wherein the strobe generator is one of a synchronous strobe generator or an asynchronous strobe generator.

3. The IC in claim 1, wherein the strobe generator comprises:
   a first flip-flop;
   a second flip-flop coupled to an output of the first flip-flop; and
   an AND gate that receives the output from the first flip-flop and an output from the second flip-flop.

4. The IC in claim 1, wherein the pattern controller comprises a plurality of combinational logic circuits that collectively generate the first array of bits and the second array of bits.

5. The IC in claim 4, wherein each of the plurality of combinational logic circuits is identical.

6. The IC in claim 1, wherein a first dynamic partial reconfigurable Input Output (DPRIO) is coupled to the multiplexer controller and a second DPRIO is coupled to the pattern controller.

7. The IC in claim 1, further comprising:
   a multiplexer operable to select an output signal from the plurality of shift registers.

8. The IC in claim 7, further comprising:
   a counter coupled to the multiplexer, wherein the counter is operable to output the output signal from the plurality of shift registers for a predefined period.

9. A frequency divider circuit, comprising:
   a shift register ring;
   a pattern controller configured to provide a control signal to the shift register ring, wherein:
      the control signal configures the shift register ring to apply a fractional divisional factor to a frequency of an input signal and to cause the shift register ring to output a signal based on the fractional divisional factor,
      the control signal comprises a first array of bits that act to set corresponding bits of the shift register ring and a second array of bits that act to clear the corresponding bits of the shift register ring, and
      the pattern controller provides corresponding bits from both the first array of bits and the second array of bits as inputs to each shift register in the shift register ring; and
   a strobe generator operable to trigger the pattern controller to output the control signal for the shift register ring.

10. The frequency divider circuit in claim 9, wherein the pattern controller comprises a plurality of combinational logic circuits that collectively generate the first array of bits and the second array of bits.

11. The frequency divider circuit in claim 9, further comprising:
   an output multiplexer outputting the signal outputted from the shift register ring.

12. The frequency divider circuit in claim 9, wherein the shift register ring is configured to alternate the input signal from a first frequency to a second frequency.

13. A method of altering a frequency of an input signal, the method comprising:
   generating a control signal based on a fractional frequency divisional factor, wherein the control signal comprises a first array of bits and a second array of bits;
   configuring a plurality of shift registers based on the control signal, wherein each shift register of the plurality of shift registers receives as inputs corresponding bits from both the first array of bits and the second array of bits, wherein each shift register of the plurality of shift registers sets according to a corresponding bit from the first array of bits and clears according to a corresponding bit from the second array of bits; and
   activating a subset of a the plurality of shift registers based on the fractional frequency divisional factor.

14. The method in claim 13, further comprising:
   selecting of an output signal received from the plurality of shift registers; and
   outputting the output signal.

15. The method in claim 13, further comprising:
   setting at least one shift register of the plurality of shift registers to one of a preset state or a clear state based on the control signal.

16. The method in claim 13, further comprising:
   receiving a first user defined input for generating the control signal.

17. The method in claim 16, further comprising:
   receiving a second user defined input;
   generating a second control signal from the second user defined input; and
   applying the second control signal to the plurality of shift registers.

18. The method in claim 13, further comprising:
   repeating an output signal from the plurality of shift registers for a predetermined count cycle.

19. The method in claim 13, further comprising:
   selecting a terminal for each multiplexer that is coupled between two consecutive shift registers; and
   transferring a multiplexer input signal through the selected terminal.

20. The method in claim 13, further comprising:
generating a trigger signal from one of a synchronous strobe generator or an asynchronous strobe generator, wherein the trigger signal triggers the control signal to be received by the plurality of shift registers; and
altering the input signal from a first frequency to a second frequency.

* * * * *